United States Patent
Geyer

(10) Patent No.: US 11,695,325 B2
(45) Date of Patent: Jul. 4, 2023

(54) METHOD AND DEVICE FOR SETTING A DEAD TIME OF SWITCHING ELEMENTS OF A HALF BRIDGE, AND INVERTER

(71) Applicant: Robert Bosch GmbH, Stuttgart (DE)

(72) Inventor: Hans Geyer, Leinfelden-Echterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 261 days.

(21) Appl. No.: 16/981,581

(22) PCT Filed: Mar. 1, 2019

(86) PCT No.: PCT/EP2019/055132
§ 371 (c)(1),
(2) Date: Sep. 16, 2020

(87) PCT Pub. No.: WO2019/174931
PCT Pub. Date: Sep. 19, 2019

(65) Prior Publication Data
US 2021/0057984 A1  Feb. 25, 2021

(30) Foreign Application Priority Data
Mar. 16, 2018 (DE) .................... 10 2018 204 017.6

(51) Int. Cl.
*H02M 1/38* (2007.01)
*H02M 7/5387* (2007.01)

(52) U.S. Cl.
CPC .......... *H02M 1/38* (2013.01); *H02M 7/5387* (2013.01)

(58) Field of Classification Search
CPC ............................. H02M 7/5387; H02M 1/38
See application file for complete search history.

(56) References Cited

U.S. PATENT DOCUMENTS

2006/0012428 A1* 1/2006 Ohkuri .................. H03F 3/2173
330/251
2014/0191700 A1  7/2014 Eberlein et al.

FOREIGN PATENT DOCUMENTS

| CN | 103033275 A * | 4/2013 | ............... G01K 7/01 |
| DE | 102011083679 | 9/2012 | |
| DE | 102011081173 | 2/2013 | |
| DE | 102012006009 | 9/2013 | |

OTHER PUBLICATIONS

International Search Report for Application No. PCT/EP2019/055132 dated Jul. 10, 2019 (English Translation, 3 pages).

* cited by examiner

*Primary Examiner* — Jue Zhang
(74) *Attorney, Agent, or Firm* — Michael Best & Friedrich, LLP

(57) ABSTRACT

The invention relates to a method for setting a dead time between the opening of a first switching element (31) of a half bridge (2) and the closing of a second switching element (32) of the half bridge (2), comprising the steps: reducing the dead time of a switching cycle relative to the dead time of a preceding switching cycle, and determining a temperature of at least one of the switching elements (31, 32); wherein the steps of reducing the dead time and of determining the temperature are repeated for subsequent switching cycles until a critical dead time is reached, in the case of which a termination condition, which depends on the determined temperature, is fulfilled; and wherein the dead time is set using the critical dead time.

14 Claims, 3 Drawing Sheets

METHOD AND DEVICE FOR SETTING A DEAD TIME OF SWITCHING ELEMENTS OF A HALF BRIDGE, AND INVERTER

BACKGROUND OF THE INVENTION

The present invention relates to a method and a device for setting a dead time between the opening of a first switching element of a half bridge and the closing of a second switching element of the half bridge. The invention further relates to an inverter and, preferably, an inverter for an electric machine.

Electric machines of drive systems can be supplied with alternating voltage via an inverter. An exemplary drive of an inverter is known from document DE 10 2011 081 173 A1. The inverter comprises a plurality of half bridges, wherein the number of half bridges corresponds to the number of phases of the electric machine. The half bridges each comprise two switching elements connected in series, wherein, in order to prevent a short circuit, the switching elements must not be closed at the same time. It is in addition necessary to ensure that in the course of the commutation, the second switching element is also not closed immediately after the opening of the first switching element. As a result of the delayed development of electromagnetic fields of the half bridge power semiconductors, cross-influences would otherwise arise that could lead to an undesirable heating of the half bridge power semiconductors. For this reason both switching elements remain opened during a dead time after the opening of the first switching element.

To ensure effective energy transfer through the inverter it is, however, desirable for the dead time to be as short as possible.

SUMMARY OF THE INVENTION

The invention provides a method for setting a dead time between switching off or opening a first switching element of a half bridge and switching on or closing a second switching element of the half bridge. The invention further provides a device for setting a dead time between the opening of a first switching element of a half bridge and the closing of a second switching element of the half bridge. The invention finally provides an inverter.

According to a first aspect, the invention accordingly relates to a method for setting the dead time between the opening of a first switching element of a half bridge and the closing of a second switching element of the half bridge. The dead time of a switching cycle is reduced for this purpose relative to the dead time of a preceding switching cycle. The temperature of at least one of the switching elements is ascertained. The reduction of the dead time and the determination of the temperature are repeated for subsequent switching cycles until a critical dead time is reached at which a stop condition is satisfied. Whether the stop condition is satisfied is determined on the basis of the ascertained temperature. The dead time is set in the light of the critical dead time.

According to a second aspect, the invention accordingly relates to a device for setting a dead time between the opening of a first switching element of a half bridge and the closing of a second switching element of the half bridge. The device comprises a control device and a temperature ascertainment device. The control device is designed to control the half bridge in such a way that the second switching element of the half bridge is closed after a dead time following the opening of the first switching element. The control device is configured to reduce the dead time of a switching cycle relative to the dead time of a preceding switching cycle, wherein, after the reduction of the dead time, the temperature ascertainment device ascertains the temperature of at least one of the switching elements. The reduction of the dead time and the ascertainment of the temperature are repeated for succeeding switching cycles until a critical dead time is reached at which a stop condition is satisfied. The stop condition depends on the ascertained temperature. The control device sets the dead time, preferably dynamically, in the light of the critical dead time.

According to a third aspect, the invention relates to an inverter with a plurality of half bridges each of which comprises two switching elements. The inverter further comprises a device for adjusting a dead time.

The invention enables a preferably dynamic adjustment of the dead times for the operation of switching elements of a half bridge. The dead time is preferably continuously reduced for this purpose, meaning that the dead time is reduced in comparison with the dead time of the preceding switching cycle. The dead time can, however, also be reduced after a predefined number of switching cycles, and thus remains constant during these switching cycles.

A switching cycle comprises a plurality of different switch states or switch positions of the switching elements of the half bridge which typically are passed through in a fixed sequence. During one particular switch state the switching elements of the half bridge each remain open or closed. The transition to a new switch state within a switching cycle occurs through opening or closing one of the switching elements. Each switching cycle preferably comprises precisely one dead time between the opening of a first switching element of the half bridge and the closing of a second switching element of the half bridge. A further dead time lies between the opening of the second switching element and the closing of the first switching element. In the case of multiple half bridges, furthermore, appropriate dead times can be assigned to these.

The first switching element is, for example, opened during a switching cycle and, after a first dead time has elapsed, the second switching element is closed. The second switching element is subsequently opened and the first switching element closed. In a following switching cycle, the first switching element can now again be opened until, after a second dead time has elapsed, the second switching element is again closed. The duration of the second dead time can be reduced in comparison with the duration of the first dead time.

It is possible to recognize on the basis of the ascertained temperature whether, as a result of the reduced dead time, cross-currents having a thermal effect, in particular a short circuit, occur between the switching elements. As soon as this point is reached, the critical dead time is reached, and a further reduction of the dead time leads to an even stronger heating of the switching elements, which is to be avoided. On the basis of the accurate knowledge of the critical dead time, the value for the dead time that is in fact to be used can be adjusted in such a way that it is as small as possible, in order to achieve a good efficiency, i.e. a maximum power yield, of the inverter, without giving rise to unwanted thermal effects.

Slowly developing deterioration of the switching elements have an influence on the thermal cross-influences, and accordingly on the change of the temperature when the dead time is changed. Due to the dynamic adjustment of the dead time, such aging effects of the switching elements can be compensated for.

The switching elements can preferably comprise power semiconductor switching elements, in particular metal oxide field effect transistors (MOSFETs) or bipolar transistors, in particular with an insulated gate terminal (IGBTs).

According to one preferred development of the method, the ascertainment of the temperature comprises the measurement of electric currents and/or voltages at outputs of the respective switching element. If the switching element is a MOSFET, the drain current, the drain-source voltage and the gate-source voltage can for example be measured using fast analog/digital converters during a PWM switching period, and used for ascertainment of the temperature. If the switching element is an IGBT, the analog currents and voltages at the gate, collector and emitter are measured.

According to one preferred form of embodiment of the method, the temperature of the switching element is determined with reference to the measured electric currents and voltages and with reference to a predefined characteristic curve of the respective switching element. The voltages and currents of the switching elements are temperature-dependent. The precise relationships between the values of the currents or voltages and the corresponding temperatures can be stored in look-up tables (LUT) on the basis of data sheet values.

The temperature of the corresponding switching element can thus be ascertained very quickly by means of look-up tables with reference to the measured currents and voltages. Alternatively, the temperature dependency of the currents and voltages can be calculated on the basis of physical models. By means of suitable μC circuits, the instantaneous temperature of the switching elements can be ascertained on the basis of the appropriate mathematical functions, taking the characteristic curves of the switching element into consideration.

According to one preferred development of the method, the adjustment of the dead time is performed by adding the critical dead time to a predefined safety buffer time. The safety buffer time is preferably chosen such that the set dead time is adequately far from the critical dead time, so that the thermally active cross-currents between the switching elements are sufficiently well eliminated. According to further forms of embodiment, the critical dead time can be multiplied by a predefined factor that is greater than 1 in order to obtain the adjusted dead time. According to one preferred development of the method, the ascertained temperature is compared with a predefined temperature threshold value to ascertain the critical dead time. The stop condition is satisfied if the ascertained temperature exceeds the predefined temperature threshold value.

According to one preferred form of embodiment, the stop condition depends on a change in the temperature determined after at least one switching cycle. The change in the temperature difference between two sequential switching cycles can, for example, be considered. The stop condition is satisfied if this exceeds a predefined threshold value.

According to one preferred development of the method, a gradient of the ascertained temperature is compared with a predefined gradient threshold value to ascertain the critical dead time. The gradient of the ascertained temperature can, for example, be a change in the ascertained temperature as a function of time during a process of switching off, or also the change in the ascertained temperature as a function of the dead time. The stop condition is satisfied if the gradient exceeds the predefined gradient threshold value.

According to preferred forms of embodiment, it is possible to ascertain whether a significant increase in the temperature takes place after the change to the dead time within a predefined measuring time period. The temperature increase can be compared here with a predefined threshold value. Because the thermal effects act slowly, the measuring time period can, according to the measures of the semiconductor cooling, extend from a few milliseconds up to several hundred milliseconds.

According to one preferred development of the method, the adjustment of the dead time is carried out successively for all the half bridges of an inverter. A dead time between the opening of the first switching element of the respective half bridge and the closing of the second switching element of the respective half bridge is adjusted for each of the half bridges, and a dead time between the opening of the second switching element of the respective half bridge and the closing of the first switching element of the respective half bridge is furthermore set. For an exemplary B6 bridge, which is composed of three half bridges, six different dead times are accordingly adjusted and set.

According to one preferred development of the method, the half bridge is an element for an electric supply to a drive machine. In particular the half bridge can be part of an inverter for such a drive machine. The method is preferably performed when the drive machine is being operated at zero load, meaning that either no torque at all, or at least only a very low torque, is output. The drive machine can be a drive for a motor vehicle. By operating at zero load, the continuous switching of the half bridges is ensured.

According to a development of the method, the half bridge is an element of an inverter, wherein the setting of the dead time takes place during a switching-on process of the inverter and/or during a switching-off process of the inverter. In this way an adjustment of the dead times over the operating lifetime or service lifetime of the inverter is achieved so that, in particular, aging effects can be corrected.

The temperature is preferably ascertained during the dead time. A continuous temperature curve can be determined in this case, for example through the generation of multiple temperature measurement values and interpolation of the temperature measurement values, or alternatively only one single measurement value can be ascertained during the dead time. It is, however, also possible to measure the temperature in each case at a time point that is outside the dead time, for example shortly after the end of the dead time.

According to one preferred development of the device, the temperature ascertainment device comprises a sensor for measuring currents and voltages at outputs of the respective switching elements.

According to one preferred development of the device, the control device is configured to determine the temperature of the switching element on the basis of the measured currents and voltages, taking a predefined characteristic curve of the respective switching element into account.

BRIEF DESCRIPTION OF THE DRAWINGS

Here.

In all the figures, elements and devices that are identical or have the same function are given the same reference signs. The numbering of method steps serves for clarity, and is not intended in general to imply a specific temporal sequence. Multiple method steps can, in particular, also be carried out simultaneously.

DETAILED DESCRIPTION

Figure 1:
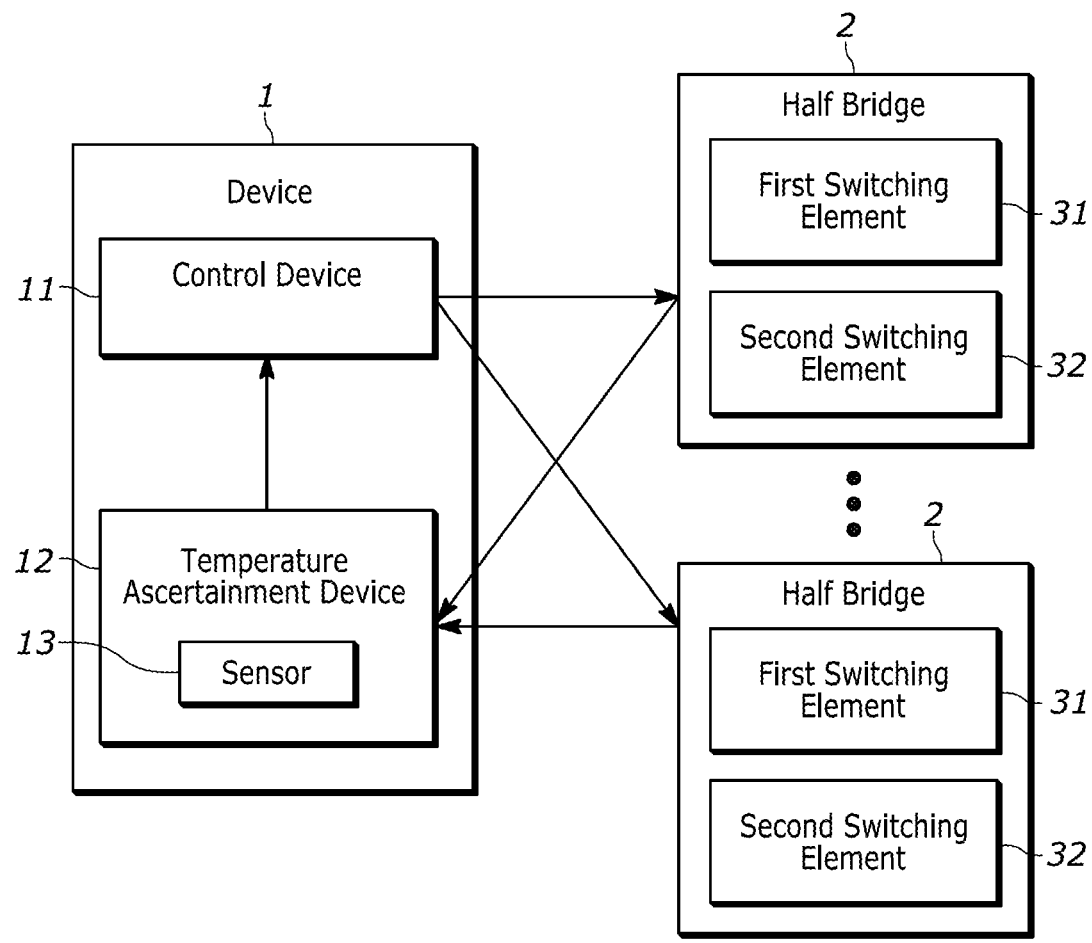
FIG. 1 shows a schematic block diagram of a device for setting the dead time according to one form of embodiment of the invention.

FIG. 1 shows a schematic block diagram of a device 1 for setting a dead time tTD between the opening of a respective first switching element 31 and the closing of a respective second switching element 32 of half bridges 2. The half bridges 2 can be part of an inverter which in turn can be an element of an electric drive system. The inverter is connected for this purpose to a DC voltage source, and converts the DC voltage provided at the input side into an alternating voltage that is provided at the output side to a multiphase electric machine. For each phase of the electric machine, the inverter comprises a corresponding half bridge 2. A three-phase electric machine, for example, can be driven by means of a B6 bridge consisting of three half bridges 2.

The switching elements 31, 32 are arranged in series between a positive input terminal of the inverter and a negative input terminal of the inverter. A connecting point between the first and second switching elements of the half bridge 2 is coupled in each case to a phase terminal of the electric machine. The switching elements 31, 32 can for example comprise MOSFETs or IGBTs. The invention is not, however, restricted to such elements. The switching elements can rather be arbitrary semiconductor switching elements.

The device 1 comprises a control device 11 that is configured to drive the half bridges 2 of the inverter. The device 1 can for this purpose itself be an element of the inverter, or can also be a unit separate from the inverter. The control device 11 transmits a drive signal to the respective half bridge 2, so that the second switching element 32 of the half bridge 2 is closed after a dead time tTD after the opening of the first switching element 31. The finely-stepped adjustment of the dead time tTD through adjustment of the switch-on and switch-off times of the switching elements 31, 32 can be carried out by software routines of a microcontroller. The dead time tTD can be varied in the nanosecond range. The switching edges at the PWM outputs can be shifted by means of software.

The switch-on and switch-off processes of the switching elements 31, 32 are affected by numerous factors. These include, for example, the switch-on and switch-off delay times of the switching elements and further minimum on-times and off-times or dead times necessary for the drive and for the interlock, measurement, protection and monitoring functions. Delay times also arise in the driver, whose temperature dependency and aging behavior are not known.

Unwanted thermal cross-effects can occur if a dead time tTD is too short. The control device 11 is therefore designed to initially set the dead time tTD to an initial value that is chosen to be large enough that interfering thermal effects are not to be expected. Such a value can, for example, be determined empirically. The control device 11 is designed to successively reduce the dead time tTD starting from the initial value.

The device 1 further comprises a temperature ascertainment device 12 that determines a temperature T of the two switching elements 31, 32. For reasons of accuracy, the temperature ascertainment device 12 is preferably designed for ascertainment of the temperature of the first switching element 31 identically as for ascertainment of the temperature of the second switching element 32. For setting the dead time tTD between the opening of the first switching element 31 and the closing of the second switching element 32, the temperature ascertainment device 12 can, for example, ascertain the temperature of the first switching element 31. According to further forms of embodiment, the temperature ascertainment device 12 can, however, also ascertain a first temperature T1 of the first switching element 31 and a second temperature T2 of the second switching element 32.

The temperature ascertainment device 12 preferably comprises current sensors and voltage sensors that are designed to measure voltages present at the outputs of the switching elements 31, 32 or currents flowing through the outputs. The sensor elements can, in particular, measure a drain current, a drain-source voltage and a gate-source voltage of a MOSFET, or corresponding currents and voltages at the gate, collector and emitter of an IGBT. The device 1 can further comprise a memory device in which characteristic curves of the respective switching elements are stored which represent the temperature dependency of the switching elements. Using these characteristic curves and the measured currents and voltages, the temperature ascertainment device 12 ascertains the junction temperature of the respective switching element 31, 32.

The control device 11 monitors the temperature ascertained during the adjustment of the dead time tTD. A corresponding temperature value or a temperature curve can be determined for this purpose during each dead time tTD. If an absolute temperature or a temperature rise, or a change in the ascertained temperature for two successively following dead times, exceeds a predefined threshold value, the control device 11 recognizes that the temperature is rising too much, so that a stop criterion is fulfilled and a critical dead time tK has been reached. In particular, the control device 11 can compare a gradient of the ascertained temperature with the predefined threshold value. The threshold value can be specified depending on the thermal properties of the corresponding switching elements 31, 32. The temperature sensitivities of the switching elements 31, 32 can in particular be taken into consideration in order to specify the threshold value.

The control device 11 now ascertains a new dead time tTD that is to be specified or set by adding a predefined safety buffer to the critical dead time tK. Alternatively, the critical dead time tK can be multiplied by a predefined factor greater than 1.

The control device 11 is designed to then drive the half bridge in such a way that the dead time tTD between the opening of the first switching element 31 and the closing of the second switching element 32 is set to the ascertained value.

The adjustment described is then preferably repeated for the dead time tTD between the opening of the second switching element 32 and the closing of the first switching element 31. The respective dead times tTD for all further half bridges 2 are then determined dynamically.

Figure 2:
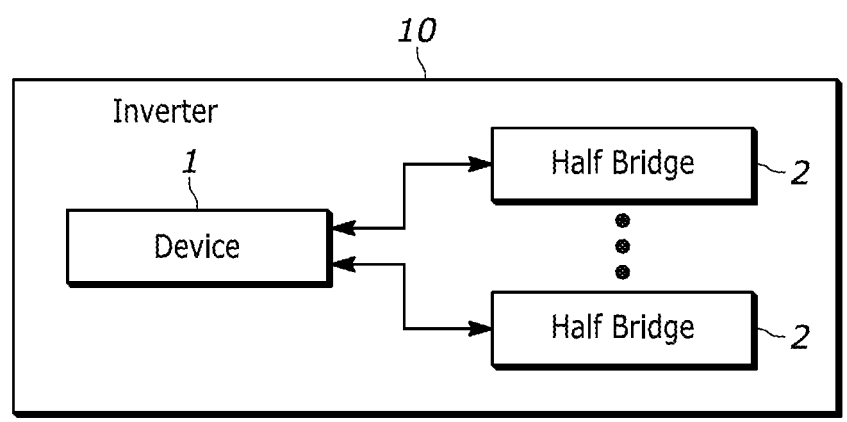
FIG. 2 shows a schematic block diagram of an inverter according to one form of embodiment of the invention.

A schematic block diagram of an inverter 10 according to one form of embodiment of the invention is illustrated in FIG. 2. The inverter 10 comprises a plurality of half bridges 2, for example three half bridges 2 in the form of a B6 bridge. Each of the half bridges 2 comprises a first switching element 31 and a second switching element 32. The inverter 10 further comprises a device 1 described above for setting dead times tTD between the opening of one switching element 31, 32 of the half bridge 2 and the closing of the respective other switching element 31, 32 of the half bridge 2.

Figure 3:
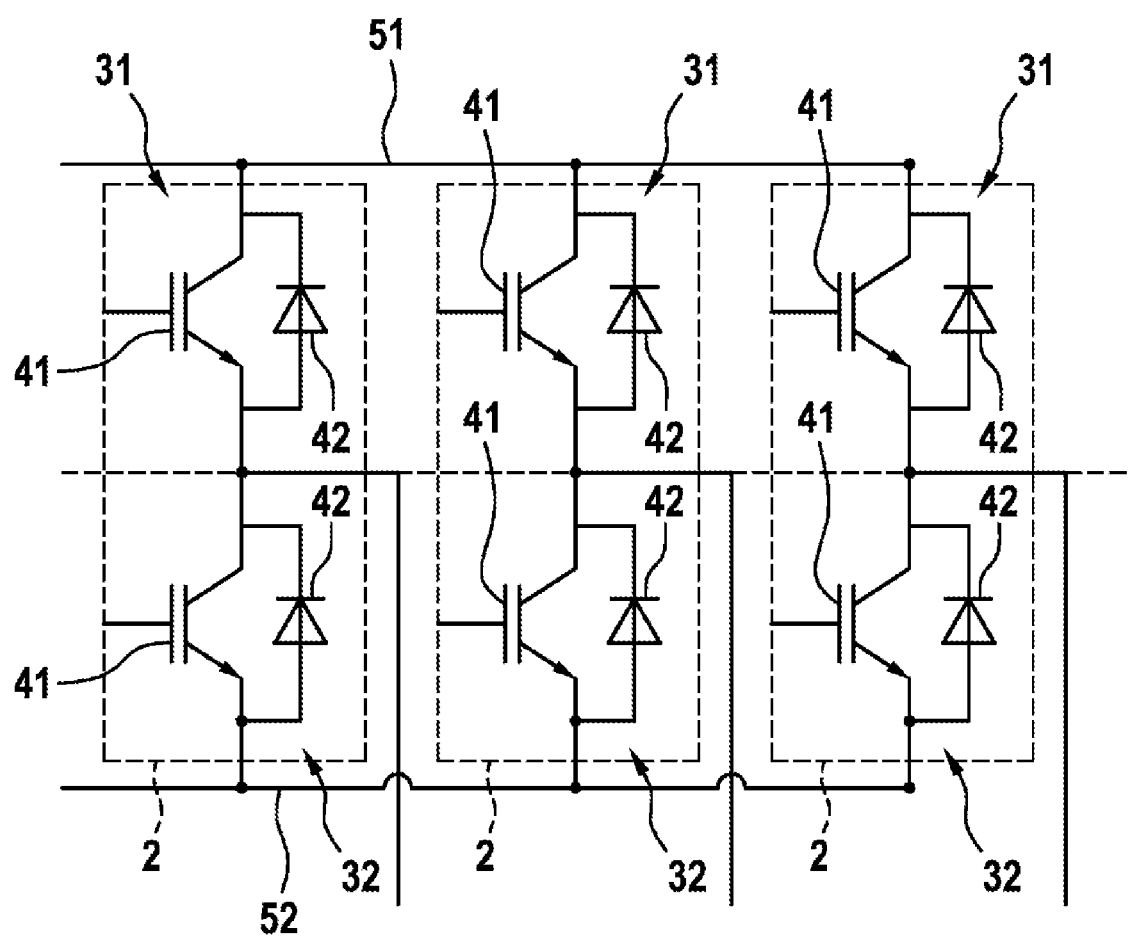
FIG. 3 shows a schematic circuit diagram of half bridges of the inverter.

An exemplary B6 bridge circuit is illustrated in FIG. 3, as can be used in an inverter 10 according to the invention. The inverter 10 comprises three half bridges 2 that are connected between a positive high side 51 (T+) and a negative low side 52 (T−). Each of the half bridges 2 comprises a first (high side) switching element 31 and a second (low side) switching element 32 with respective semiconductor switches 41 and freewheeling diodes 42 connected in parallel. The semiconductor switches 41 are, for example, MOSFETs or IGBTs. The connecting nodes between the first switching elements 31 and the second switching elements 32 are each connected to one phase terminal of an electric machine. The invention is not, however, restricted to the illustrated form of embodiment. The inverter 10 can thus have an arbitrary number of half bridges 2.

Figure 4:
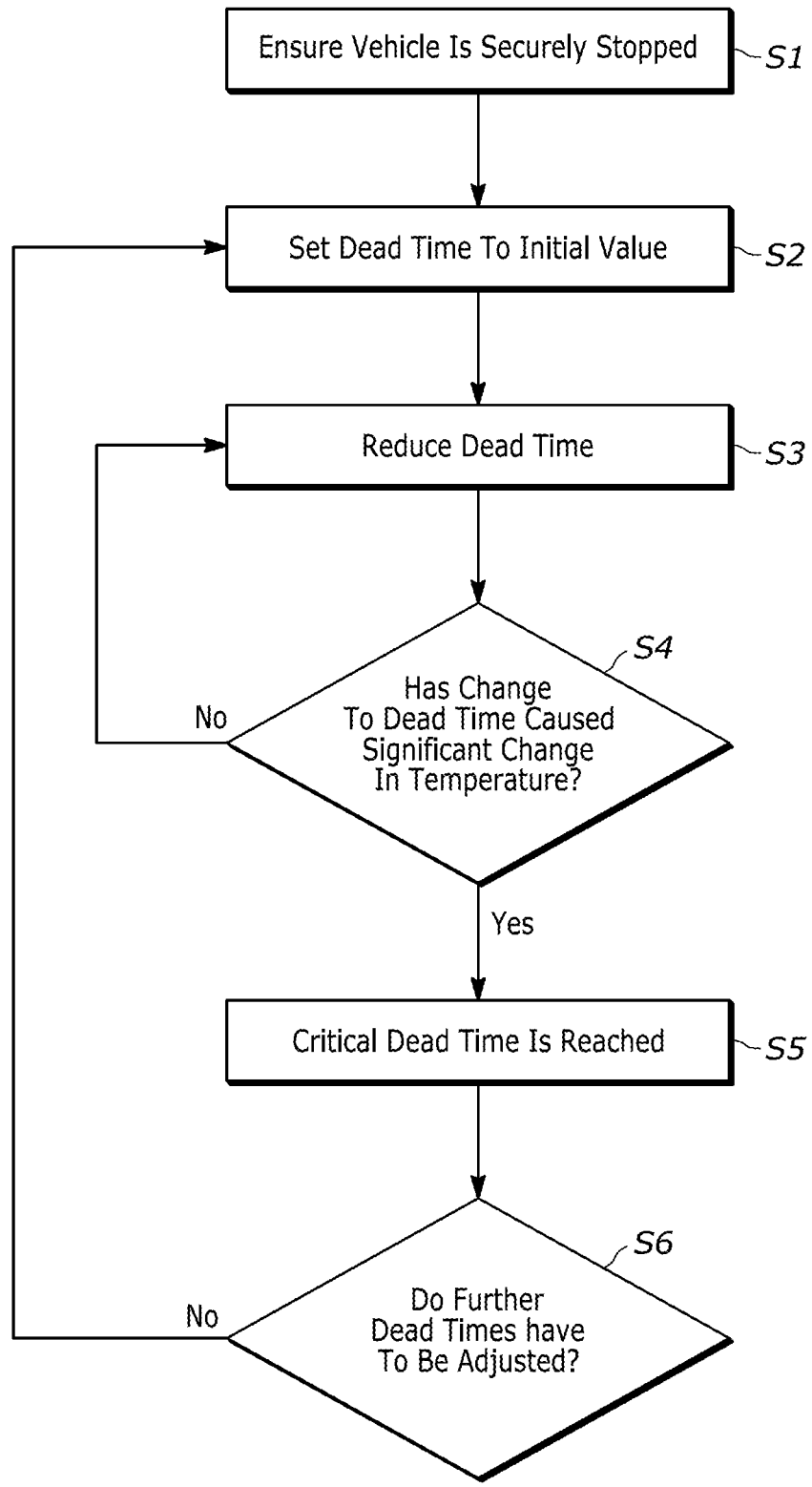
FIG. 4 shows a schematic flow diagram of a method for setting a dead time according to one form of embodiment of the invention.

A flow diagram of a method for setting a dead time tTD between the opening of a first switching element 31 of a half bridge 2 and the closing of a second switching element 32 of the half bridge 2 is illustrated in FIG. 4.

The half bridge 2 can be an element of an inverter 10 that converts the electric energy provided by a DC voltage source into an alternating voltage and provides it to an electric machine, in particular an electric machine of a motor vehicle. In a first method step S1 it is for this purpose ensured that the vehicle is securely stopped, i.e. is secured against rolling away, for example through activating a handbrake of the vehicle. The inverter 10 is then placed in an operating mode in which either no torques, or only insignificant torques, are generated at the drive wheels of the vehicle. The continuous switching of the switching elements 31, 32 must at the same time be ensured in this zero-torque control. The method is thus preferably carried out with zero load.

The dead time tTD between the opening of the first switching element 31 and the closing of the second switching element 32 is set in a method step S2 to an initial value that is not critical for any of the semiconductor elements.

The dead time tTD is successively reduced in a method step S3, in parallel with which the temperature of at least one of the switching elements 31, 32 is ascertained.

Whether the change to the dead time tTD has brought a significant change in the temperature is recognized in a method step S4. For example, the temperature, or a gradient of the temperature, can be compared with a predefined threshold value. If the temperature, or the gradient of the temperature, i.e. for example the derivative of the temperature with respect to the dead time tTD, does not exceed the threshold value, then the dead time tTD is further reduced, S3. Otherwise, the fact that a critical dead time tK has been reached is recognized in a method step S5. A stop criterion is satisfied, and the stepwise reduction in the dead time tTD is halted. The dead time tTD is set in the light of the critical dead time tK. A safety buffer time is preferably added for this purpose to the critical dead time tK in order to obtain the adjusted dead time tTD.

Whether further dead times tTD have to be adjusted is checked in a method step S6. For each half bridge 2, two dead times tTD must be adjusted, on the one hand the dead time tTD between the opening of the first switching element 31 of the half bridge 2 and the closing of the second switching element 32 of the half bridge 2 and, on the other hand, the dead time tTD between the opening of the second switching element 32 of the half bridge 2 and the closing of the first switching element 31 of the half bridge 2. The method steps S2 to S5 are carried out for all of the half bridges 2, and in each case for both of the switching elements 31, 32. Thus in the case of the B6 half bridge illustrated in FIG. 3, a total of six dead times tTD are set. Once all of the dead times tTD have been adjusted, the method ends.

The ascertained, adjusted dead times tTD can be placed into a non-volatile memory and can be used when the method is carried out again for setting the initial value of the dead time tTD. The method is preferably carried out again after predefined periods of time in order to compensate for aging effects and changing ambient conditions. The method can, for example, be carried out every time the inverter is switched on and/or switched off, or during passive phases.

The invention claimed is:

1. A method for setting a dead time between the opening of a first switching element (31) of a half bridge (2) and the closing of a second switching element (32) of the half bridge (2), the method comprising:
   reducing the dead time of a switching cycle relative to the dead time of a preceding switching cycle, and
   ascertaining a temperature of at least one of the switching elements (31, 32);
      wherein the steps of reducing the dead time and ascertaining the temperature are repeated for subsequent switching cycles until a critical dead time at which a stop condition is satisfied that depends on the temperature ascertained is reached;
      wherein the dead time is set in the light of the critical dead time; and
      wherein the setting of the dead time occurs by adding a predefined safety buffer time to the critical dead time.

2. The method as claimed in claim 1, wherein ascertaining the temperature comprises a measurement of currents, voltages, or both currents and voltages at outputs of the respective switching element (31, 32).

3. The method as claimed in claim 2, wherein the temperature of the switching element (31, 32) is determined based on the measured currents and voltages and of a predefined characteristic curve of the respective switching element (31, 32).

4. The method as claimed in claim 1, wherein the stop condition involves the ascertained temperature exceeding a predefined temperature threshold value.

5. The method as claimed in claim 1, wherein the stop condition depends on a change in the ascertained temperature after at least one switching cycle.

6. The method as claimed in claim 1, wherein the stop condition involves a gradient of the ascertained temperature exceeding a predefined threshold value.

7. The method as claimed in claim 1, wherein the setting of the dead time is performed successively for all of the half bridges (2) of an inverter (10), wherein in each case a first dead time between the opening of the first switching element (31) of the respective half bridge (2) and the closing of the second switching element (32) of the respective half bridge (2) is set and a second dead time between the opening of the second switching element (32) of the respective half bridge (2) and the closing of the first switching element (31) of the respective half bridge (2) is set.

8. The method as claimed in claim 1, wherein the half bridge (2) is an element of a drive machine, and wherein the drive machine is operated at zero load while the dead time is set.

9. The method as claimed in claim 1, wherein the half bridge (2) is an element of an inverter (10), wherein the setting of the dead time takes place during a switch-on procedure of the inverter (10) and/or during a switch-off procedure of the inverter (10).

10. The method as claimed in claim 1, wherein the ascertainment of the temperature of the at least one of the switching elements (31, 32) takes place during the dead time.

11. An inverter (10) with a plurality of half bridges (2) each of which comprises two switching elements (31, 32) and a device (1) as claimed in claim 10 for setting dead times between the opening and the closing of respective switching elements (31, 32) of the half bridges (2).

12. A device (1) for setting a dead time between the opening of a first switching element (31) of a half bridge (2) and the closing of a second switching element (32) of the half bridge (2), the device comprising:
- a control device (11) configured to drive the half bridge (2) in such a way that the second switching element (31) of the half bridge (2) is closed after a dead time following the opening of the first switching element (31); and
- a temperature ascertainment device (12) that is designed to ascertain a temperature of at least one of the switching elements (31, 32);
    wherein the control device (11) is designed to reduce the dead time of a switching cycle relative to the dead time of a preceding switching cycle, wherein the temperature ascertainment device (12) is designed, following the reduction of the dead time, to ascertain the temperature of at least one of the switching elements (31, 32), wherein the control device (11) and the temperature ascertainment device (12) are designed to repeat the reduction of the dead time and the ascertainment of the temperature for subsequent switching cycles until a critical dead time is reached at which a stop condition is satisfied that depends on the ascertained temperature, wherein the control device (11) is designed to set the dead time in the light of the critical dead time, and wherein the setting of the dead time occurs by adding a predefined safety buffer time to the critical dead time.

13. The device (1) as claimed in claim 12, wherein the temperature ascertainment device (12) comprises a sensor (13) for measuring electric currents, voltages, or both currents and voltages at outputs of the respective switching element.

14. The device (1) as claimed in claim 12, wherein the control device (11) is configured to determine the temperature (T) of the switching element (31, 32) on the basis of the measured electric currents and voltages and a predefined characteristic curve of the respective switching element (31, 32).

* * * * *